United States Patent
Lee et al.

(10) Patent No.: US 7,037,124 B2
(45) Date of Patent: May 2, 2006

(54) JUNCTION BOX FOR VEHICLES AND METHOD FOR ASSEMBLING THE SAME

(75) Inventors: Cheol-Seob Lee, Daegu (KR); Jong-Keun Song, Daegu (KR)

(73) Assignee: Tyco Electronics AMP Korea, Ltd., Kyungsangbuk-Do (KR)

( * ) Notice: Subject to any disclaimer, the term of this patent is extended or adjusted under 35 U.S.C. 154(b) by 0 days.

(21) Appl. No.: 11/061,926

(22) Filed: Feb. 18, 2005

(65) Prior Publication Data

US 2005/0186811 A1    Aug. 25, 2005

(30) Foreign Application Priority Data

Feb. 19, 2004   (KR)   ............. 10-2004-0011070

(51) Int. Cl.
*H01R 13/62* (2006.01)

(52) U.S. Cl. ............ 439/157; 439/949; 439/76.2; 439/347

(58) Field of Classification Search .......... 439/347, 439/372, 157, 949, 76.2
See application file for complete search history.

(56) References Cited

U.S. PATENT DOCUMENTS

| | | | |
|---|---|---|---|
| 5,391,086 A * | 2/1995 | Woller et al. | 439/157 |
| 5,681,175 A * | 10/1997 | Busse et al. | 439/157 |
| 5,915,982 A * | 6/1999 | Kashiyama et al. | 439/157 |
| 5,919,053 A * | 7/1999 | Tsuji et al. | 439/157 |
| 5,928,012 A * | 7/1999 | Kitamura | 439/157 |
| 5,964,602 A * | 10/1999 | Aoki et al. | 439/157 |
| 5,967,808 A * | 10/1999 | Kubota | 439/157 |
| 6,010,341 A * | 1/2000 | Matsuoka | 439/76.2 |
| 6,077,100 A * | 6/2000 | Sakano | 439/347 |
| 6,168,445 B1 * | 1/2001 | Seutschniker et al. | 439/157 |
| 6,193,530 B1 * | 2/2001 | Sakurai et al. | 439/157 |
| 6,213,795 B1 * | 4/2001 | Drescher et al. | 439/157 |
| 6,217,354 B1 * | 4/2001 | Fencl et al. | 439/157 |
| 6,244,880 B1 * | 6/2001 | Fukase et al. | 439/157 |
| 6,305,957 B1 * | 10/2001 | Fink et al. | 439/157 |
| 6,325,647 B1 * | 12/2001 | May et al. | 439/157 |
| 6,345,995 B1 * | 2/2002 | Bigotto et al. | 439/157 |
| 6,361,336 B1 * | 3/2002 | Zhao et al. | 439/157 |
| 6,375,481 B1 * | 4/2002 | Zweigle | 439/157 |
| 6,382,992 B1 * | 5/2002 | Bouchan et al. | 439/157 |
| 6,641,423 B1 * | 11/2003 | Giro | 439/347 |
| 6,652,298 B1 * | 11/2003 | Ohnuki | 439/157 |
| 6,666,697 B1 * | 12/2003 | Yamashita | 439/157 |
| 6,705,882 B1 * | 3/2004 | Casses | 439/157 |
| 6,733,314 B1 * | 5/2004 | Konda | 439/157 |
| 6,739,889 B1 * | 5/2004 | Daggett et al. | 439/157 |
| 6,824,406 B1 * | 11/2004 | Sharples et al. | 439/157 |
| 6,887,089 B1 * | 5/2005 | Nishide | 439/157 |

(Continued)

FOREIGN PATENT DOCUMENTS

JP   2000-013954   1/2000

(Continued)

*Primary Examiner*—Ross Gushi
(74) *Attorney, Agent, or Firm*—Barley Snyder LLC

(57) ABSTRACT

A vehicle junction box for rapidly and easily assembling a connector using a quick connector and a method for assembling the same is disclosed. The junction box includes a case having an accommodating section receiving the lower side of a connector, a power distribution center having a fixing section receiving the upper side of the connector, guides formed at the sides of the connector, recesses receiving the guides, guide grooves having openings formed in a movable bar moved forward and rearward, and a manipulation part moving the movable bar forward and rearward so as to open and close the openings.

13 Claims, 9 Drawing Sheets

U.S. PATENT DOCUMENTS

| | | | |
|---|---|---|---|
| 6,926,545 B1* | 8/2005 | Fukamachi et al. | 439/157 |
| 6,960,090 B1* | 11/2005 | Denter et al. | 439/157 |
| 2002/0072261 A1* | 6/2002 | Pade | 439/157 |
| 2002/0081877 A1* | 6/2002 | Ohnuki | 439/157 |
| 2003/0109155 A1* | 6/2003 | Yamashita | 439/157 |
| 2005/0064749 A1* | 3/2005 | Stella et al. | 439/157 |
| 2005/0106911 A1* | 5/2005 | Sharples et al. | 439/157 |

FOREIGN PATENT DOCUMENTS

| | | |
|---|---|---|
| KR | 10-2000-0063917 A | 11/2000 |

* cited by examiner

JUNCTION BOX FOR VEHICLES AND METHOD FOR ASSEMBLING THE SAME

FIELD OF THE INVENTION

The present invention relates to a vehicle junction box having a plurality of connectors, and more particularly to a vehicle junction box for rapidly and easily assembling a connector in quick connector style and a method for assembling the same.

BACKGROUND

Various electrically operated components and driving devices (hereinafter refer to as "electrical components") and a battery for supplying electricity to the electrical components are generally installed in vehicles.

A junction box is provided between the battery and the electrical components and serves to distribute electricity supplied from the battery to respective electrical components. FIG. 6 is an exploded perspective view illustrating an example of a conventional junction box for vehicles.

As shown in the drawing, the conventional junction box includes a case 100 installed in a vehicle, a power distribution center 200 installed at the upper side of the case 100 and provided with a plurality of fuses and relays, a protective cover 300 disposed above the power distribution center 200, and a plurality of connectors 400 assembled to the power distribution center 200.

At tie lower side of the power distribution center 200, a built-in printed circuit board is provided with a plurality of grounded male terminals (not shown), and at the inside of each connector 400, a plurality of female terminals (not shown) corresponding to the male terminals are provided in the connector 400.

A screw hole 401 at the central portion of each connector 400, and the power distribution center 200 is provided with a bolt 500 fastened into the screw hole 401.

A user installs the power distribution center 200 at the upper side of the case 100 so as to fasten the bolts 500 to the corresponding connectors 400, and then the connectors 400 are assembled to the power distribution center 200.

In the conventional junction box constructed as above, since each connector is fixed in place by one bolt, the assembly of the conventional junction box is very complicated.

Moreover, since a worker has to use tools in order to fasten the bolts and cannot accurately gauge the torque applied to the bolts or threading errors, the case of the power distribution center may be damaged.

Furthermore, after extended periods of time the bolts may be vibrated free, thus generating noise or separating the connectors.

SUMMARY

Therefore, the present invention has been made in view of the above and/or other problems, and it is an object of the present invention to provide a vehicle junction box that is rapidly and easily assembled using quick connectors.

It is another object of the present invention to provide a vehicle junction box including a manipulating lever so that a worker performs the assembly of the vehicle junction box while confirming whether the connector is assembled well or not.

It is still another object of the present invention to provide a vehicle junction box capable of maintaining an opened state of an opening by fixing a preset position of a movable bar.

It is still another object of the present invention to provide a vehicle junction box in which a connector's position is automatically fixed and released so as to prevent the connector from moving during the assembly of the junction box.

It is still another object of the present invention to provide a vehicle junction box in which a lever is fixed close to a power distribution center if necessary.

Moreover, it is still another object of the present invention to provide a method of easily and rapidly assembling a vehicle junction box using quick connectors.

In accordance with the present invention, the above and other objects can be accomplished by the provision of a junction box for vehicles including a case formed with an accommodating section receiving a lower portion of a connector is through the upper side of the accommodating section, and a power distribution center installed to the upper side of the case and formed with a fixing section into which an upper portion of the connector is inserted through the lower side of the fixing section. A plurality of guides are formed at the sides of the connector. Recesses are formed at the end of the sidewall of the fixing section, into which the guides are inserted. Guide grooves are provided having openings formed at the opposite side of a movable bar and corresponding to the recesses. The movable bar is installed at the inner side of the sidewall to move forward and rearward. A manipulation part is provided for moving the movable bar forward and rearward so as to open and close the openings.

Preferably, the manipulation part includes a pivotable lever installed at the side of the power distribution center, and a connecting part for connecting the side of the movable bar to the lower side of the lever.

The junction box further includes a fixing device for fixing and releasing the position of the movable bar according to the movement of the movable bar.

The junction box further includes an attaching/detaching device for fixing and releasing the connector to and from the inside of the accommodating section.

The junction box further includes a lever-fixing device for fixing and releasing the lever to and from the power distribution center.

In accordance with the present invention, the above objects and aspects can be accomplished by the provision of a method for assembling a junction box for vehicles including:

(1) a connector arranging step of inserting a connector provided with a plurality of first terminals into an accommodating section of a case, and withdrawing electric wires connected to the first terminals through the lower side of the connector out of a drain hole formed at the side of the case;

(2) a power distribution center assembling step of assembling a power distribution center provided with second terminals corresponding to the first terminals to the upper side of the case after the connector arranging step, and positioning the movable bar in place by moving a movable bar horizontally moved in the fixing part in a desired direction so as to engage the movable bar with the fixing part formed at the outer side of the connector; and (3) a connector coupling step of moving the movable bar in the other direction, after the power distribution center assembling step, so as to connect the first terminals to the second terminals while the fixing part engaged with the movable bar ascends.

BRIEF DESCRIPTION OF THE DRAWINGS

These and/or other objects and advantages of the present invention will become apparent and more readily appreciated from the following description of the embodiments, taken in conjunction with the accompanying drawings, in which.

DETAILED DESCRIPTION OF THE EMBODIMENT(S)

Hereinafter, a junction box for a vehicle according to the preferred embodiment of the present invention will be described with reference to the accompanying drawings.

Figure 1:
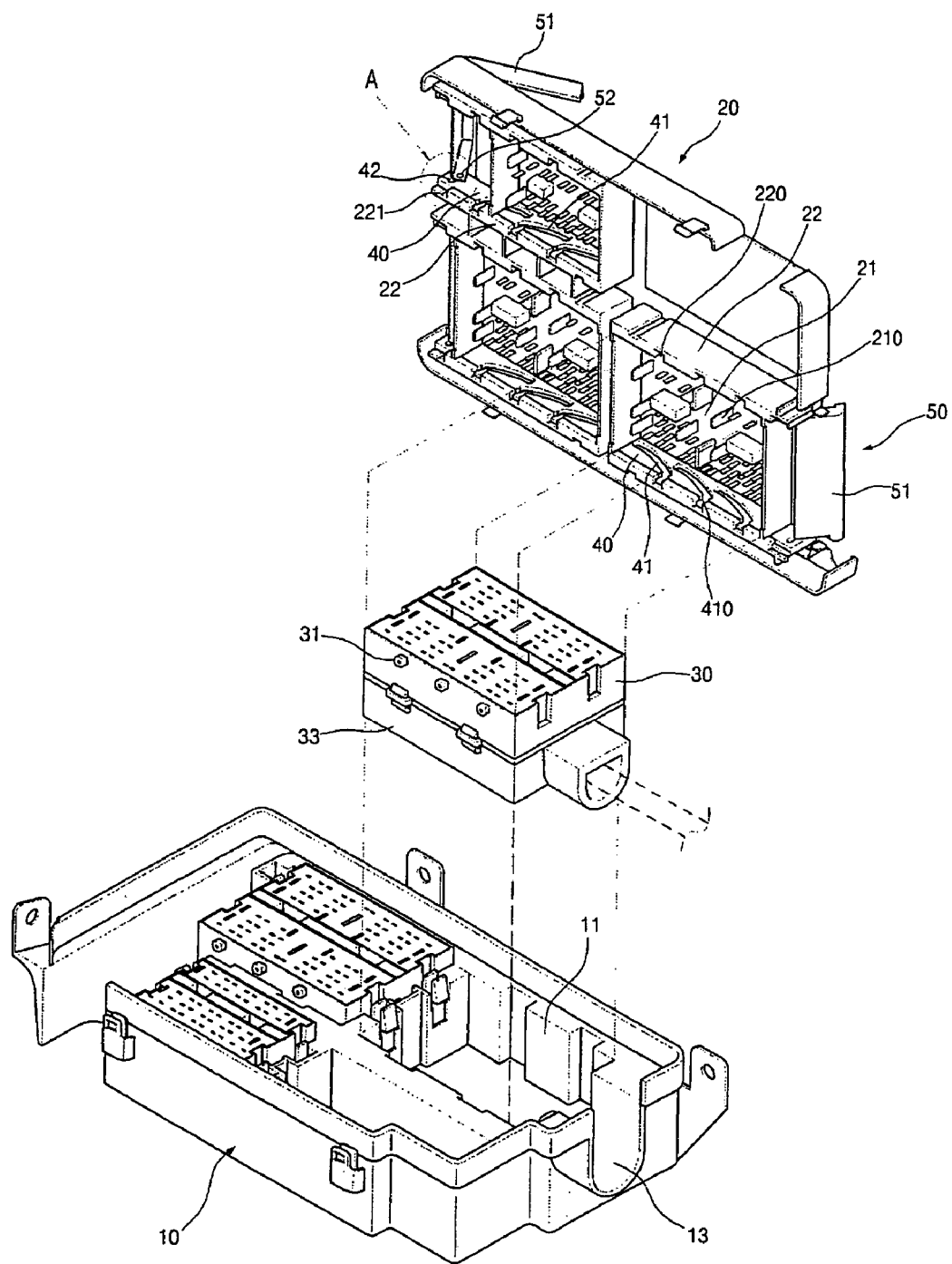
FIG. 1 is an exploded perspective view illustrating a junction box for a vehicle according to the preferred embodiment of the present invention.
Figure 2:
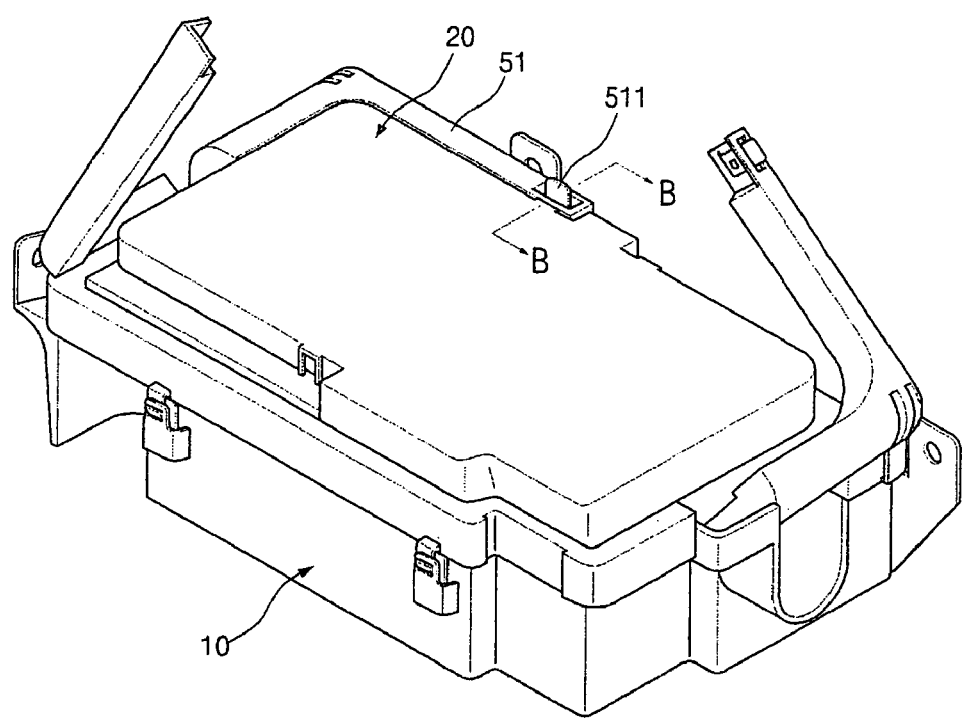
FIG. 2 is a perspective view illustrating the junction box in FIG. 1 in an assembled state.

FIG. 1 is an exploded perspective view illustrating the junction box for a vehicle according to the preferred embodiment of the present invention, and FIG. 2 is a perspective view illustrating an assembled state of the junction box shown in FIG. 1. As shown in the drawings, the vehicle junction box includes a case 10 provided with a plurality of connectors 30 and installed in the vehicle, and a power distribution center 20 installed above the case.

An accommodating section 11, into which the lower portions of the connectors 30 are inserted, is formed at the upper side of the case 10. A fixing section 21, into which the upper portions of the connectors 30 are inserted, is formed at the lower side of the power distribution center 20. The fixing section 21 is provided with a plurality of second terminals 210.

A plurality of guides 31 are respectively provided at the upper sides of each connecter 30 at regular intervals. Recesses 220, into which the guides 31 are inserted, are formed at the edge of the sidewall 22. Movable bars 40 are installed to the inner surface of the side wall 22, such that they are movable in the forward and rearward directions.

Guide grooves 41 have openings 410 corresponding to the recesses 220 and are formed at a second end of the movable bar 40. The guide grooves 41 are slanted in a desired direction so that the guides 31 of the connectors 30 are inserted into the guide grooves 41 and move vertically according to the movement of the movable bar 40.

Moreover, manipulation parts 50 for simultaneously moving a pair of movable bars 40, provided at the fixing section 21, forward and rearward are respectively installed at the sides of the power distribution center 20. In this embodiment of the present invention, each manipulation part 50 includes a lever 51 pivotably installed at the side of the power distribution center 20, and a connecting part for connecting a first end of the movable bar 40 to the lower side of the lever 51.

The connecting part is constructed so as to connect the lower end of the lever 51 to the first end of the movable bar 40, and to move the movable bar 40 forward and rearward when manipulating the lever 51. In this embodiment, the connecting part includes a longitudinal hole 42 vertically formed at the first end of the movable bar 40, and a connecting pin 52 protruded from the end of the lever 51 and inserted into the longitudinal hole 42.

First terminals (not shown) corresponding to the second terminals 210 of the power distribution center 20 are fixed at the inside of each connector 30, and electric wires for supplying electric power to the first terminals are provided at the lower side of each terminal 30.

A retainer 33 for covering the electric wires is attached to the lower side of each connector 30, and the accommodating section 11 is formed with a drain hole 13 so as to draw the electric wires out.

The assembly of the junction box constructed as above will be described as follows.

First, the connectors 30 are inserted into the accommodating sections 11 of the case 10, and a connector-arranging step is performed. In the connector arranging step the electric wires to be connected to the lower sides of the connectors 30 are drawn out of the drain holes 13.

After the connector-arranging step, a power distribution center-assembling step is performed. In the power distribution center-assembling step, the power distribution center 20 is assembled to the upper side of the case 10, and the connectors 30 are positioned by moving the movable device provided in the fixing section 21 in a forward/rearward direction so as to be mechanically engaged with a fixing device provided at the outer side of each connector 30.

In this embodiment, the movable bar 40 formed with the guide grooves 41 serves as the movable device, and the guides 31 formed at the sides of the connectors 30 serve as the fixing device.

After the power distribution center assembling step, a connector connecting step is performed, wherein the movable device is moved in the opposite forward/rearward direction so as to engage the first terminals with the second terminals while the fixing device engaged with the movable device ascends vertically. A detailed description follows with reference to FIG. 3.

Figure 3A:
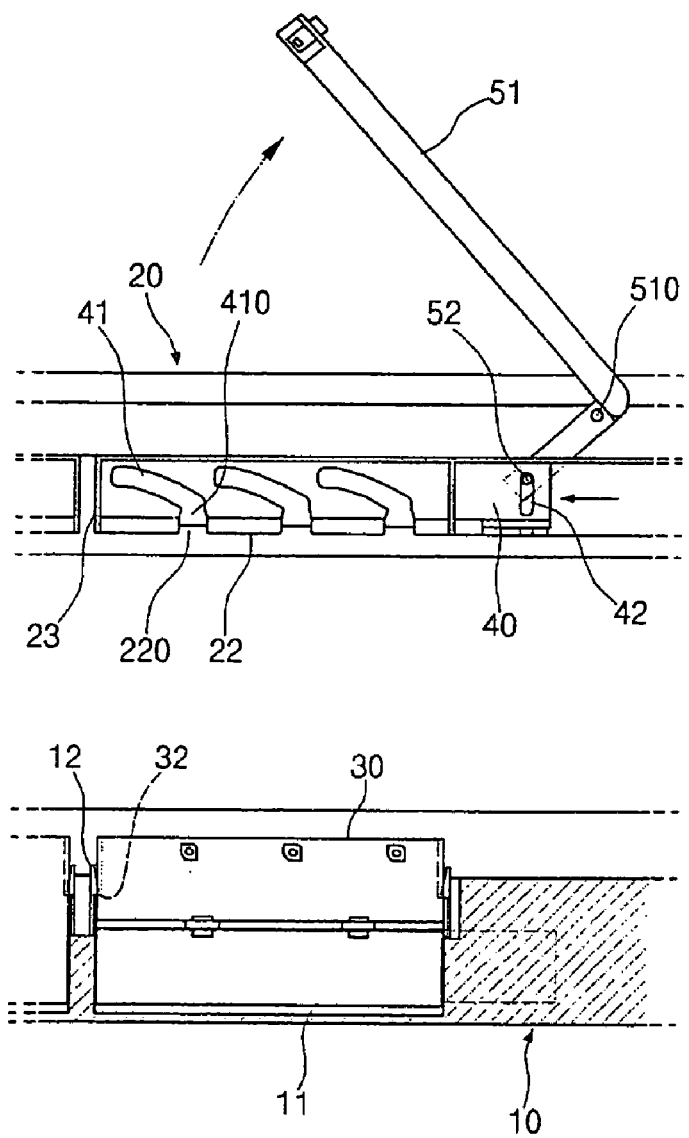
FIG. 3a is a detail cross-sectional view of the junction box of FIGS. 1 and 2 before installation of the power distribution center.
Figure 3B:
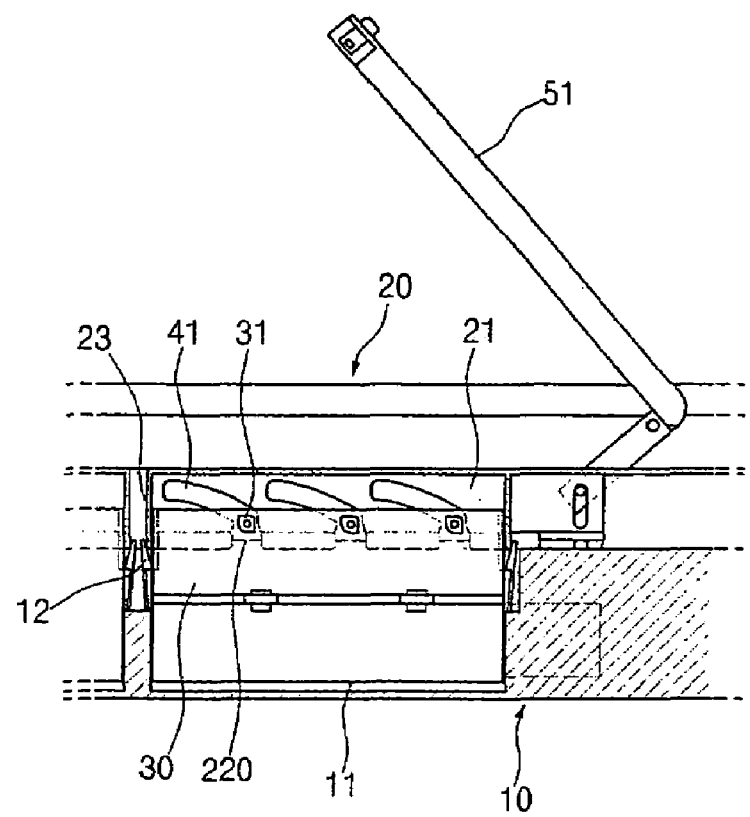
FIG. 3b is a detail cross-sectional view of the junction box of FIGS. 1 and 2 after installation of the power distribution center.
Figure 3C:
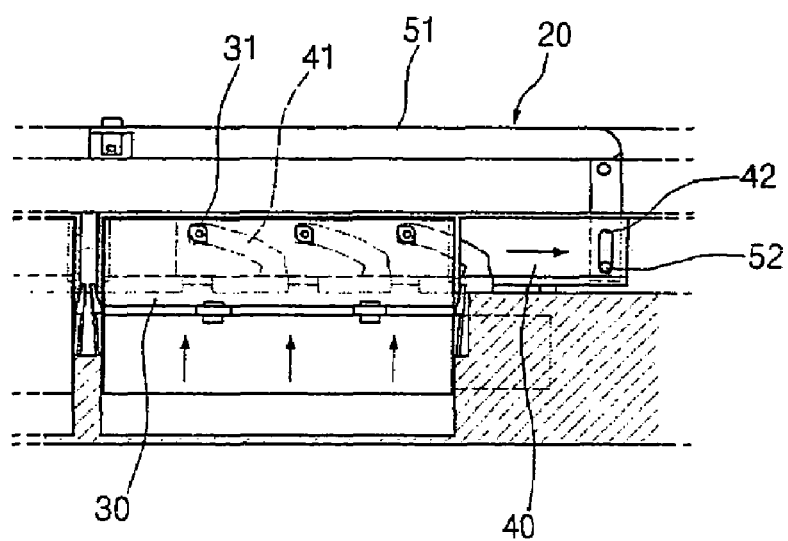
FIG. 3c is a detail cross-sectional view of the junction box of FIGS. 1 and 2, illustrating the assembly of the connector.

FIGS. 3a, 3b and 3c are a cross-sectional view of a main part of the junction box illustrating operation of the junction box according to the preferred embodiment of the present invention. FIG. 3a is a cross-sectional view illustrating the power distribution center before installation. As shown, the lever 51 is pivotably installed to the side of the power distribution center 20 by means of a hinge pin 510, the movable bar 40 is formed with a longitudinal hole 42 in the vertical direction at the end of the movable bar 40, and the lever 51 is provided with a connecting pin 52 formed at the lower end of the lever 51 and inserted into the longitudinal hole 42.

Thus, when pivoting the lever 51 upward, the connecting pin 52 ascends along the longitudinal hole 42 so as to advance the movable bar 40 (to the left in FIG. 3ial), while the recess 220 formed at the sidewall 22 is aligned with the opening 410 of the guide groove 41 formed at the opposite end of the movable bar 40 so that the connector 30 is positioned, namely, preset at a desired position.

The lower portion of the connector 30 is inserted into the accommodating section 11 of the case 10, and the accommodating section 11 is provided with an attaching/detaching device for temporally fixing the inserted connector 30 so as to prevent the connector 30 from moving during the assembly of the junction box.

In this embodiment, the attaching/detaching device includes at least two locking jaws 32 formed at the sides of the connector 30, elastic pieces 12 formed at the inside of the accommodating section 11 in correspondence to the locking jaws 32 and to fix the upper sides of the locking jaws 32 when the connector 30 is inserted, and a release member 23 for pressing the elastic pieces 12 to be fixed when the power distribution center 20 is installed.

FIG. 3b is a cross-sectional view illustrating the installation of the power distribution center. As shown in FIG. 3a, the connector 30 is fixed to the accommodating section 11 of the case 10, the lever 51 is pivoted upward so as to open the opening 410 of the guide groove 41, and then the power distribution center 20 is installed to the upper side of the case 10.

As shown in the drawings, after installing the power distribution center 20, the upper side of the connector 30 is inserted into the fixing section 21, and then the guides 31 formed at the sides of the connector 30 are inserted into the openings 410 of the guide grooves 41 via the recesses 220.

Moreover, the release member 23 formed at the bottom of the power distribution center 20 is fitted between the elastic pieces 12 so as to release the elastic pieces 12 from their fixed state, so that the connector 30 can freely move vertically.

FIG. 3c is a cross-sectional view illustrating the assembly of the connector. As shown in FIG. 3b, when the connector 30 is released and the guides 31 are inserted into the openings 410 of the guide grooves 41, the lever 51 is manipulated so as to completely assemble the connector 30 to the fixing section 21 of the power distribution center 20.

As shown in the drawings, when the lever 51 is pivoted downward, the connecting pin 52 descends along the longitudinal hole 42 so as to move the movable bar 40 rearward (to the right in FIG. 3b), during these actions, the guides 31 of the connector 30 move along the guide grooves 41 of the movable bar 40.

Thus, the connector 30 ascends vertically due to the slant of the guide grooves 41 so as to completely insert and fix the power distribution center 20 into the fixing section 21. Simultaneously, the terminals, provided at the power distribution center 20 and the connector 30, are engaged with each other, so that the electric power can be supplied.

Meanwhile, when the lever 51 is pivoted upward, the movable bar 40 moves forward as shown in FIG. 3b, during the movement, the guides 31 of the connector 30 move vertically along the guide grooves 41 of the movable bar 40 so that the connector 30 is fully separated from the fixing section 21.

Figure 4A:
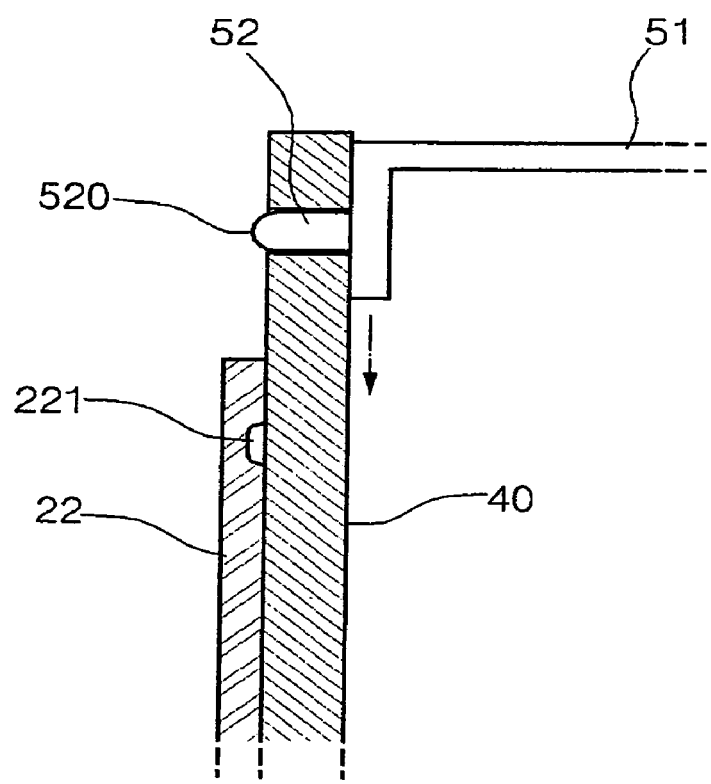
FIG. 4a is a detail cross-sectional view of the junction box of FIGS. 1 and 2 illustrating the movable bar prior to fixing.
Figure 4B:
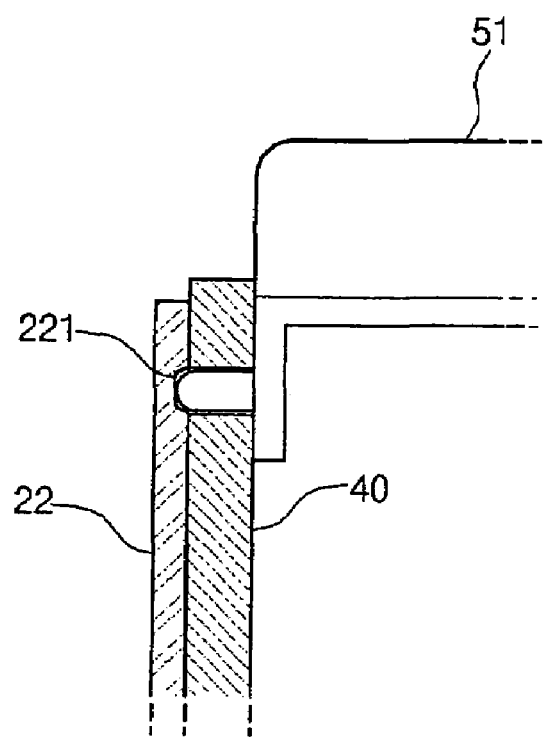
FIG. 4b is a detail cross-sectional view of the junction box of FIGS. 1 and 2 illustrating the movable bar after fixing.

FIG. 4a and 4b are a cross-sectional view illustrating operation of portion "A" in FIG. 1. When the movable bar 40 moves forward to align the openings 410 of the guide grooves 41 with the recesses 220 of the sidewall 22, the fixing device fixes and releases the position of the movable bar 40 while the openings 410 are opened. The fixing device will be described as follows.

FIG. 4a is a cross-sectional view illustrating the movable bar prior to fixing, and FIG. 4b is a cross-sectional view illustrating the movable bar after fixing. As shown in the drawings, the fixing device includes a fixing recess 221 formed at the sidewall 22 of the fixing section 21, and an inserting part 520 inserted into and separated from the fixing recess 221 when the movable bar 40 moves. In this embodiment, the inserting part 520 is formed at the end portion of the connecting pin 52 of the lever 51.

When the movable bar 40 moves forward by pivoting the lever 51, the openings 410 of the guide grooves 41 are opened as shown in FIG. 1, and the inserting part 520 is inserted into the fixing recess 221, so that the preset position of the movable bar 40 is fixed. As such, the worker can easily keep the opening in the opened state without additional action such as grasping the movable bar 40 to fix the preset position during the assembly of the junction box.

Figure 5:
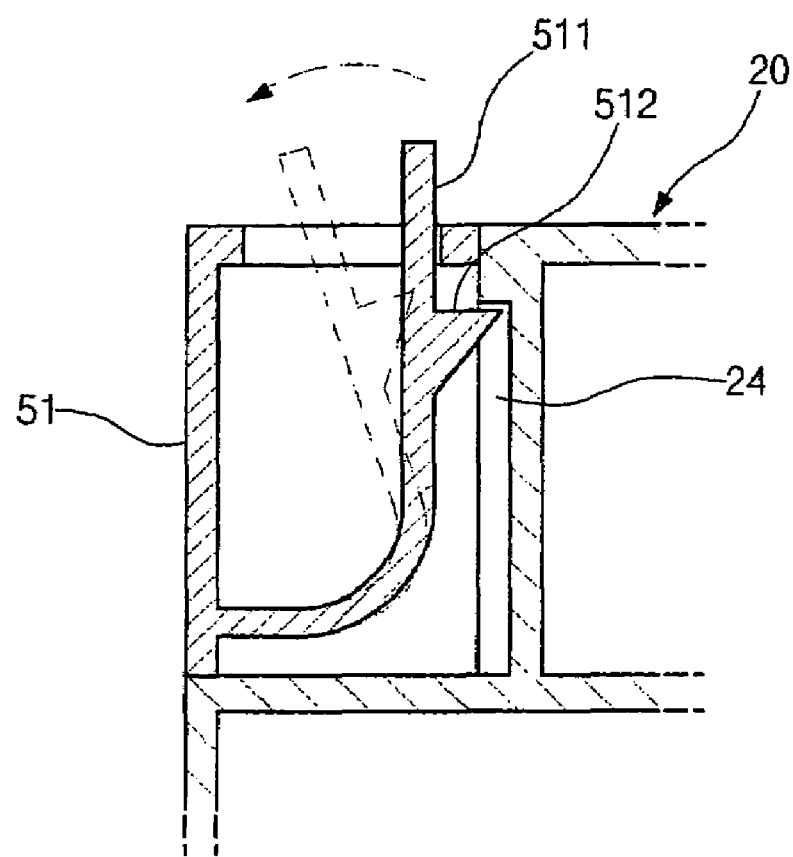
FIG. 5 is a detail cross-sectional view of the junction box of FIGS. 1 and 2 taken along the line B—B in FIG. 2.
Figure 6:
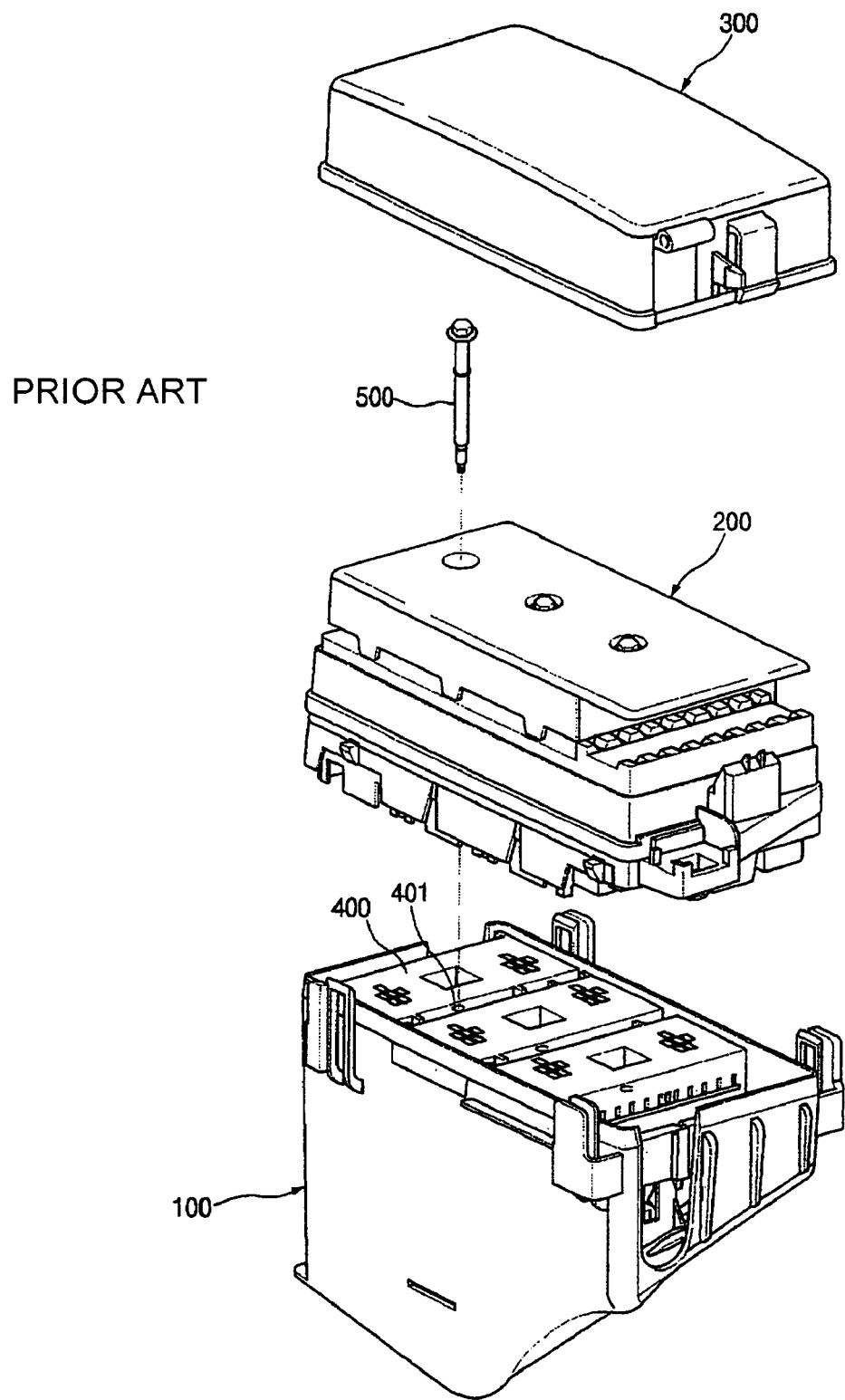
FIG. 6 is an exploded perspective view illustrating a conventional junction box for a vehicle.

FIG. 5 is a cross-sectional view taken along the line B-B in FIG. 2. As shown in FIG. 5, a lever-fixing device is provided so that the lever 51 is fixed to and released from the power distribution center 20 when the lever 51 is pivoted downward, namely, the connectors 30 are completely assembled.

The lever fixing device includes an elastic member 511 provided at the end portion of the lever 51, the locking part 24 formed at the upper side of the power distribution center 20, and a locking jaw 512 formed at the side of the elastic member 511 and locked by the locking part 24 when the lever 51 is pivoted downward.

Since the upper portion of the elastic member 511 is exposed over the lever 41, the worker pulls the exposed upper portion of the elastic member 511 back in the direction depicted by the arrow in FIG. 5, so that the locking jaw 512 is easily released from the locked state and the lever 41 is ready to pivot.

As described above, since the junction box according to the present invention can be easily and rapidly assembled, productivity and convenience for assembling the junction box can be compared to the conventional junction box assembled by bolts. Moreover, according to the junction box of the present invention, noise is not generated from the junction box, and the connectors are not separated from the junction box.

Moreover, since the manipulating lever employing the lever principle is provided so that the worker can confirm whether the connecter is assembled using his/her hands' sensibility, whether the connectors are coupled completely or not is precisely perceived during assembling the junction box, different from when assembling the conventional junction box, so as prevent the components from being damaged.

Since there is no additional work for fixing the preset position of the movable bar by fixing the preset position during assembly of the junction box, the assembly of the junction box can be easily and rapidly performed.

Since the junction box according to the present invention is constructed to automatically fix and release the position of the connectors so as to prevent the connectors from moving, the assembly of the junction box can be easily and rapidly performed.

Moreover, since the lever closely contacts the power distribution center, inconvenience due to the protrusion of the lever is avoided when the junction box is used, and the volume of the junction box can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A junction box for vehicles comprising:
   a case formed with an accommodating section into which the lower side of a connector is accommodated through the upper side of the accommodating section;
   a power distribution center installed to the upper side of the case and formed with a fixing section into which the upper side of the connector is inserted through the lower side of the fixing section;

a plurality of guides formed at the sides of the connector;

recesses, formed at the end of the sidewall of the fixing section, into which the guides are inserted;

guide grooves having openings, the guide groves being formed in a movable bar, installed at the inner side of the side wall to move forward and rearward, and corresponding to the recesses; and a manipulation part for moving the movable bar forward and rearward so as to open and close the openings, by alignment of the guide grooves and recesses.

2. The junction box as set forth in claim 1, wherein the manipulation part comprises:

a lever pivotably installed at the side of the power distribution center; and a connecting part for connecting an end of the movable bar opposite the guide grooves to the lower end of the lever.

3. The junction box as set forth in claim 2, wherein the connecting part comprises:

a longitudinal hole vertically formed at the side of the movable bar; and a connecting pin protruded from the side of the lever and inserted into the longitudinal hole.

4. The junction box as set forth in claim 2, further comprising a lever fixing means for fixing and releasing the lever to and from the power distribution center.

5. The junction box as set forth in claim 4, wherein the lever fixing means comprises:

a locking part formed at the upper side of the power distribution center; and an elastic member having a locking jaw integrated with the lever and formed at the side of the elastic member corresponding to the locking part.

6. The junction box as set forth in claim 1, further comprising a fixing means for fixing and releasing the position of the movable bar when the openings are opened.

7. The junction box as set forth in claim 6, wherein the fixing means comprises:

a fixing recess formed at the sidewall of the fixing section; and an insertion part inserted into and separated from the fixing recess when the movable bar moves.

8. The junction box as set forth in claim 1, further comprising an attaching/detaching means for fixing and releasing the connector to and from the inside of the accommodating section.

9. The junction box as set forth in claim 8, wherein the attaching/detaching means comprises:

at least two locking jaws respectively formed at the sides of the connector; elastic pieces formed at the inside of the accommodating section so as to correspond to the locking jaws and fixing the upper sides of the locking jaws when the connector is inserted; and a release member for pressing the elastic pieces to be released when the power distribution center is installed on the case.

10. A method for assembling a junction box for vehicles comprising the steps of:

inserting a connector provided with a plurality of first terminals and fixing means into an accommodating section of a case, and withdrawing electric wires connected to the first terminals through the lower side of the connector out of a drain hole formed at the side of the case;

assembling a power distribution center with second terminals corresponding to the first terminals to the upper side of the case after the connector is inserted into the case, and positioning a movable means in place by moving the movable means horizontally in a first direction in a fixing part formed in the power distribution center to a desired preset position so as to engage the movable means with the fixing means formed at the outer side of the connector; and moving the movable means horizontally in a second direction opposite the first direction, after the power distribution is assembled, so as to connect the first terminals to the second terminals while the fixing means engaged with the movable means ascends.

11. The method as set forth in claim 10, wherein, the connector is fixed to the inside of the accommodating section in the step of inserting the connector in the case, and the connector is automatically released from its locked state when the power distribution center is assembled to the case.

12. The method as set forth in claim 10, further comprising a preset position fixing step of automatically fixing the position of the movable means before and after the movement of the movable means.

13. The method as set forth in claim 12, wherein a lever performs the horizontal movement of the movable means, and the lever is provided at the outer side of the power distribution center.

* * * * *